United States Patent
Zakel et al.

(10) Patent No.: US 7,049,213 B2
(45) Date of Patent: May 23, 2006

(54) METHOD FOR PRODUCING A CONTACT SUBSTRATE AND CORRESPONDING CONTACT SUBSTRATE

(75) Inventors: Elke Zakel, Falkensee (DE); Ghassem Azdasht, Berlin (DE)

(73) Assignees: Pac Tech-Packaging Technologies GmbH, Nauen (DE); Smart Pac GmbH Technology Services, Nauen (DE)

(*) Notice: Subject to any disclaimer, the term of this patent is extended or adjusted under 35 U.S.C. 154(b) by 0 days.

(21) Appl. No.: 10/333,767

(22) PCT Filed: May 22, 2002

(86) PCT No.: PCT/DE02/01865

§ 371 (c)(1),
(2), (4) Date: May 19, 2003

(87) PCT Pub. No.: WO02/096170

PCT Pub. Date: Nov. 28, 2002

(65) Prior Publication Data

US 2003/0186527 A1    Oct. 2, 2003

(30) Foreign Application Priority Data

May 23, 2001  (DE) ................. 101 25 497

(51) Int. Cl.
*H01L 21/44* (2006.01)

(52) U.S. Cl. .............. 438/612; 438/106; 438/107; 438/112; 438/118; 438/613; 438/614

(58) Field of Classification Search ........ 438/612, 438/106, 107, 111, 112, 122, 118, 613, 614
See application file for complete search history.

(56) References Cited

U.S. PATENT DOCUMENTS

| 5,474,458 | A | * | 12/1995 | Vafi et al. ................ 439/91 |
| 5,497,545 | A | * | 3/1996 | Watanabe et al. .......... 29/830 |
| 6,013,876 | A |   | 1/2000 | Caporizzo |
| 6,072,148 | A | * | 6/2000 | Azdasht ................. 219/121.63 |
| 6,198,634 | B1 | * | 3/2001 | Armezzani et al. ........ 361/760 |
| 6,281,577 | B1 | * | 8/2001 | Oppermann et al. ....... 257/724 |
| 6,478,906 | B1 | * | 11/2002 | Azdasht et al. ........... 156/73.1 |
| 6,651,891 | B1 | * | 11/2003 | Zakel et al. .............. 235/487 |

FOREIGN PATENT DOCUMENTS

DE     43 20 055     12/1994

(Continued)

*Primary Examiner*—Maria F. Guerrero
(74) *Attorney, Agent, or Firm*—McGlew & Tuttle, P.C.

(57) ABSTRACT

The invention relates to a method for producing a contact substrate (10) as well as to a contact substrate with through-plating between a connector arrangement (21) arranged at the top of a dielectric carrier substrate (12) and the underside of the carrier substrate, wherein the connector arrangement extends along an aperture margin (22) of a substrate recess (15), and the underside (11) of the carrier substrate (12) is supported by a backstop (23), wherein a formed solder material part (24) is placed in the substrate recess (15), and in a subsequent method-related step said formed solder material part (24) is deformed within the substrate recess so as to form a formed contact part (50), such that radial displacement of the material of the formed solder material part in the substrate recess results in a non-positive connection between an intrados surface (28) of the substrate recess and the connector arrangement (21), and that the formed contact part provides through-plating between the connector arrangement (21) and the underside (11) of the carrier substrate.

19 Claims, 3 Drawing Sheets

FOREIGN PATENT DOCUMENTS

Figure 1:
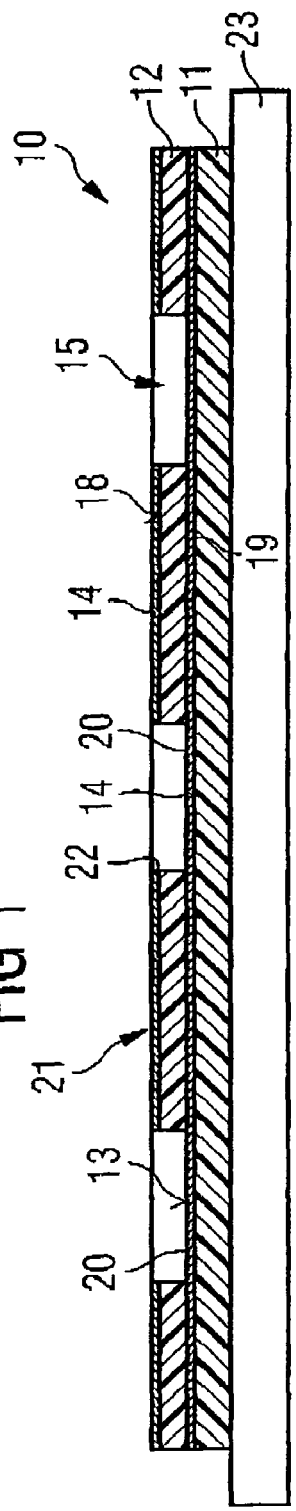

| | | |
|---|---|---|
| DE | 197 41 557 | 2/1999 |
| EP | 0 561 620 | 9/1993 |
| JP | 03 101191 | 4/1991 |
| JP | 03 233996 | 10/1991 |
| JP | 04 337695 | 11/1992 |
| JP | 05 075253 | 3/1993 |
| JP | 08 307058 | 11/1996 |
| JP | 10 326962 | 12/1998 |

* cited by examiner

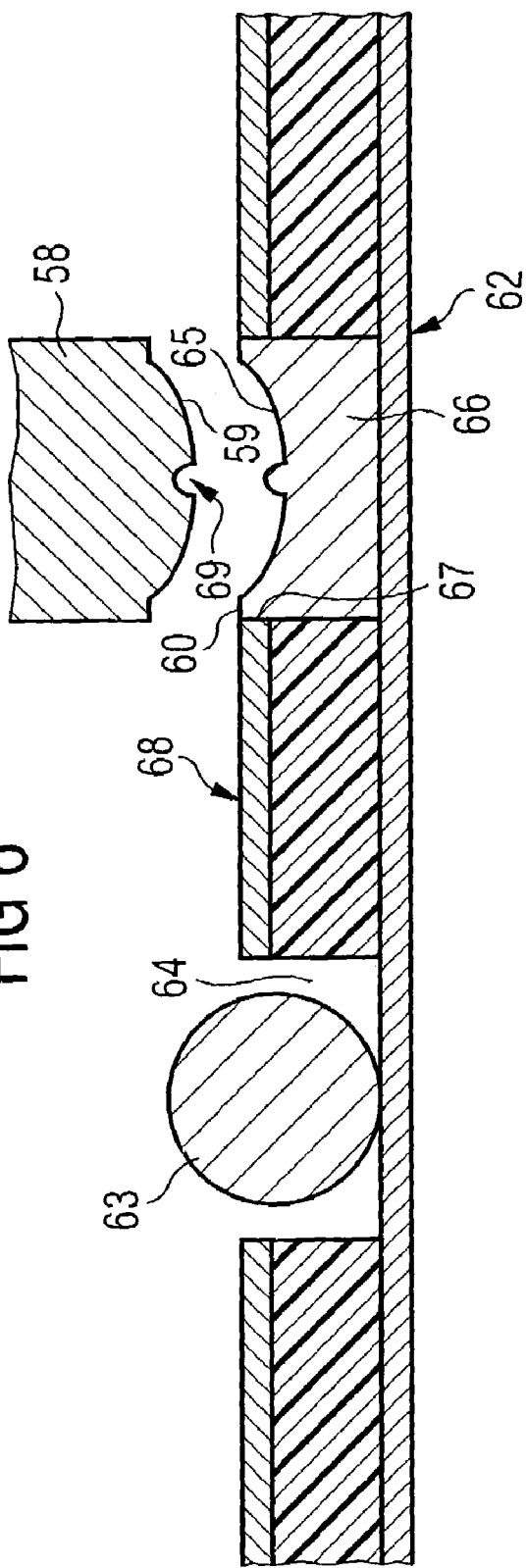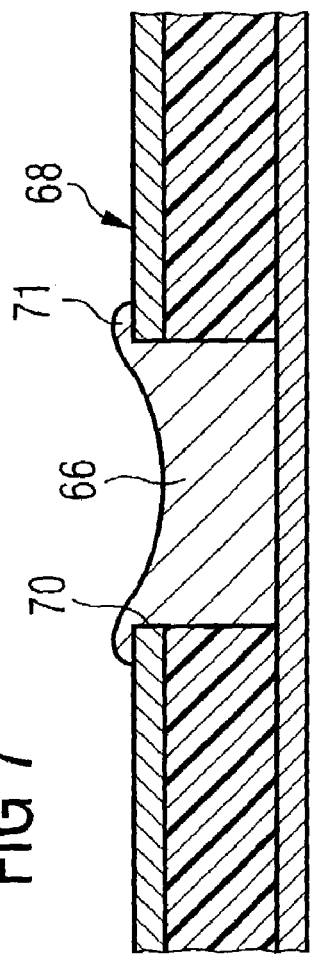

METHOD FOR PRODUCING A CONTACT SUBSTRATE AND CORRESPONDING CONTACT SUBSTRATE

The invention relates to a method for producing a contact substrate with through-plating between a connector arrangement arranged at the top of a dielectric carrier substrate and the underside of the carrier substrate, wherein the connector arrangement extends along an aperture margin of a substrate recess, and the underside of the carrier substrate is supported by a backstop. Furthermore, the invention relates to a contact substrate with through-plating, comprising a carrier substrate and a conductor path structure arranged on the carrier substrate, according to the preambles of claims 12 and 15 respectively.

Through-plating of the type mentioned above is used to electrically interconnect connector arrangements which are arranged on opposite sides of a dielectric carrier substrate, or, in the case of a single-sided arrangement of a connector arrangement on a carrier substrate, to make possible contacting of the connector arrangement from the opposite side, and in this way for example to make possible placement of electronic components on both sides of corresponding contact substrates. Up to now, contact substrates have been used for this purpose, in which substrates there is already a mechanically adhesive bond between the connector arrangement and the carrier substrate prior to establishing the actual through-plating. As a rule, this means that, by way of contact substrates, substrate carriers are used which in a prior method, which is more or less expensive, have been provided with a connector arrangement which is adhesively applied to the surface of the carrier substrate. For example, photolithographic etching methods or chemical deposition methods are well-known for this purpose.

In order to establish the actual through-plating, an electrically conductive connection made from a suitable connection material, such as for example a solder, is created between the connector arrangements arranged on both sides of the carrier substrate.

It is the object of the present invention to provide a method for producing contact substrates as well as to provide a contact substrate which makes possible simplified manufacture of contact substrates.

This object is achieved in the method according to the invention by the characteristics of claim 1.

In the method according to the invention, a formed solder material part is placed in the substrate recess, and in a subsequent method-related step said formed solder material part is deformed within the substrate recess so as to form a formed contact part, such that radial displacement of the material of the formed part in the substrate recess results in a non-positive connection between an intrados surface of the substrate recess and the connector arrangement, and so that the formed contact part provides through-plating between the connector arrangement and the underside of the carrier substrate.

Implementing the above-mentioned method thus makes possible the production of a contact substrate, starting with a carrier substrate and a connector arrangement formed independently of the carrier substrate. The non-positive connection between the carrier substrate and the connector arrangement by means of the deformed formed contact part not only makes possible an electrically conductive connection, but at the same time also a mechanical connection between the connector arrangement and the carrier substrate. The method according to the invention has a decisive advantage in that the production of the contact substrate comprising through-plating does not require prior application of an adhesive connector arrangement to the surface of a substrate carrier. Instead, the mechanical connection of the connector arrangement can be created concurrently with through-plating.

In an advantageous variant of the method, displacement takes place by forming a disc-shaped contact head which protrudes both axially and radially beyond the aperture margin of the substrate recess, with the connector arrangement being accommodated in the region of the aperture margin between the contact head and the top of the carrier substrate. This makes possible a particularly stable mechanical connection, comparable to a so-called "blind rivet connection".

In a further advantageous variant of the method, radial displacement of the material of the formed solder material part is by means of a pressure stamp with a convex contact surface, such that, apart from radial displacement, axial displacement of the material against the direction of pressure of the pressure stamp is caused too. In this process, the volume of the solder material can also be smaller than the lumen of the substrate recess without the non-positive mechanical connection being negatively affected.

If furthermore, exposure to pressure takes place by means of a pressure stamp which on its contact surface comprises a centering device, displacement becomes possible which is evenly distributed both radially and axially, i.e. a displacement state becomes possible which is symmetrical in relation to the center axis of the recess.

It is also particularly advantageous if in a method-related step which follows the step of forming the formed solder material part into a formed contact part within the substrate recess, the material of the formed part is at least partly re-melted. In this way, the purely non-positive connection which has been produced by forming the formed body, which connection in any case makes possible at least temporary fixation of the connector arrangement to the carrier substrate, can be converted to a permanent integral fixation. This can in particular be advantageous in those cases where there are more stringent requirements concerning the reliability of the non-positive connection which per se is sufficient to establish a mechanical and electrical connection.

If re-melting takes place by means of laser energy, re-melting which ranges from a locally defined part right up to complete re-melting becomes possible.

If according to an advantageous variant of the method, prior to placing the formed solder material part into the substrate recess, a second connector arrangement is arranged on the underside of the carrier substrate, between the carrier substrate and the backstop, such that the second connector arrangement at least in part forms a bottom of the substrate recess, re-melting of the formed contact part makes possible a mechanically held and electrically conductive connection between connector arrangements which are arranged on both sides of the carrier substrate, so that a contact substrate is created which makes possible a switch-technology connection on both sides of the electronic components which establish contact on the contact substrate.

An alternative to forming a contact substrate which comprises connector arrangements on both sides becomes possible if, prior to placing the formed solder material part into the substrate recess, on the underside of the carrier substrate between the substrate and the backstop a second connector arrangement is arranged, such that the second connector arrangement extends along a lower aperture margin of the substrate recess.

If irrespective of the selected variant of the method, prior to re-melting onto the contact head the formed contact part which is arranged in the substrate recess, a further formed solder material part is applied, and subsequently the solder material is, at least in part, re-melted, it is possible at the same time to form through-plating as raised contacts, commonly referred to as "bumps". In this way, through-plating can for example at the same time be used to form bump distributions such as ball grid arrays or similar, which make it possible, in a particularly simple way, to establish so-called flip chip contacting of the contact substrates. This re-melting too can be carried out via laser energy.

In a first variant, the contact substrate according to the invention comprises the characteristics of claim 12, and in a further independent variant the characteristics of claim 15.

In the contact substrate according to the invention, according to claim 12, an electrically conductive connection between the lower connector arrangement and the upper connector arrangement is formed by way of a formed contact part, such that the formed contact part completely fills up the substrate recess, and the end of the formed contact part which end is situated opposite the bottom of the substrate recess comprises a contact head which protrudes beyond the aperture margin both axially and radially, with said contact head being non-positively connected with the upper connector arrangement.

In the contact substrate constructed according to the invention, through-plating thus not only makes possible an electrically conductive connection between the connector arrangements arranged on opposite sides of the carrier substrate, but also a mechanical connection between the connector arrangements, said mechanical connection being used for fixing the connector arrangements on the carrier substrate. Furthermore, due to through-plating being made from a formed solder material part, it is possible, without any further intermediate steps, to use the solder material of the through-plating for producing an integral connection with electronic components to be contacted on the contact substrate.

In order to construct a contact substrate which is made from a carrier substrate compound, it is possible to arrange the lower conductor path arrangement on a further carrier substrate.

Through-plating in the contact substrate can be achieved by a purely mechanical forming process, such that the contact head is disc-shaped and comprises an essentially flat contact surface which extends parallel to the surface of the carrier substrate.

Alternatively, through-plating of the contact substrate, which through-plating is formed by formed contact parts, can also be re-melted after the mechanical forming process, such that the contact head comprises a meniscus-shaped raised contact.

In the further variant according to the invention, as set out in claim 15, an electrically conductive connection is formed between the lower connector arrangement and the upper connector arrangement, by way of a formed contact part, such that at its end opposite the bottom of the substrate recess the formed contact part comprises a concave contact surface with an increased contact margin which is connected in a non-positive way with the upper connector arrangement. Due to the raised contact margin it is not necessary for the formed contact part to completely fill the substrate recess.

If the second connector arrangement is arranged on a further carrier substrate, the contact substrate can also be used for a layer substrate which comprises several carrier substrate layers.

Figure 2:
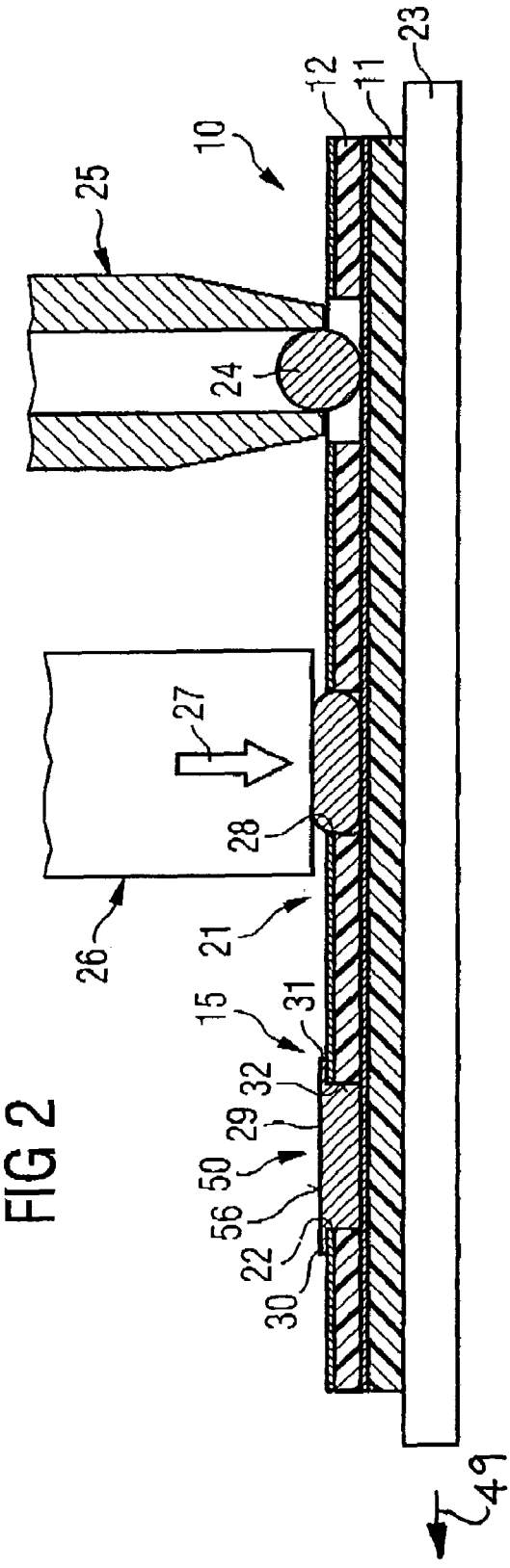
Figure 3:
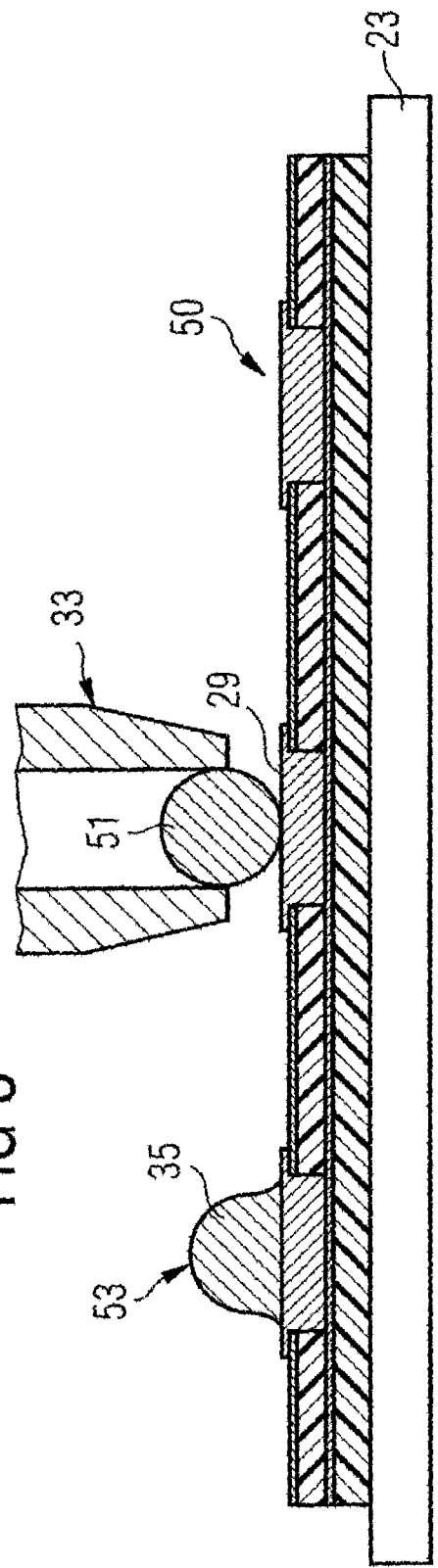
Figure 5:
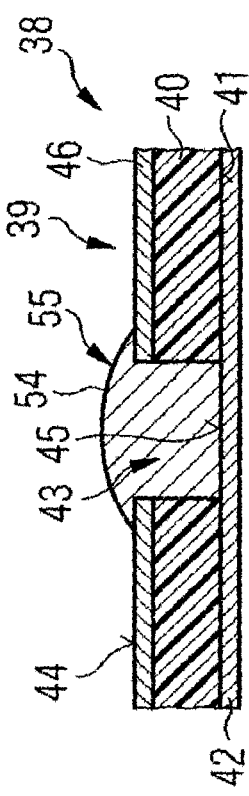
Figure 4:
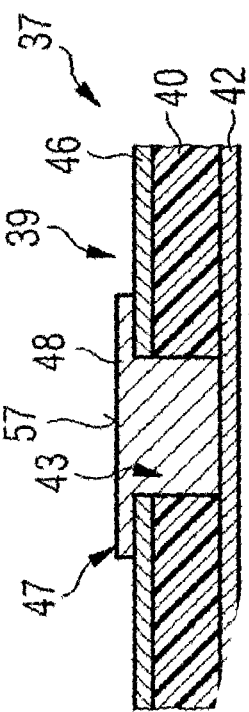

Below, preferred embodiments of the method as well as contact substrates made according to the method are explained in more detail by means of drawings. The following are shown:

FIG. 1 a carrier substrate arrangement with a double-layer arrangement of carrier substrates comprising connector arrangements;

FIG. 2 the placement of formed solder material parts in substrate recesses of the carrier substrate arrangement according to FIG. 1 with a subsequent forming process for creating formed contact parts;

FIG. 3 the placement of further formed solder material parts on the formed contact parts with a subsequent re-melting process for creating solder bumps;

FIG. 4 a first embodiment of a contact substrate;

FIG. 5 a second embodiment of a contact substrate;

FIG. 6 the production of a contact substrate with a variant of the formed contact part; and FIG. 7 the formed contact part shown in FIG. 6, after a re-melting process.

FIG. 1 shows a carrier substrate arrangement 10 comprising a lower carrier substrate 11 and an upper carrier substrate 12. At its top 13, the lower carrier substrate 11 comprises a connector arrangement 14 which in the case shown comprises a conductor path structure formed on the top 13 by means of the deposit method. In the present case, the carrier substrate 11 and the carrier substrate 12 comprise polyamide; however, in principle, in the method explained below, other dielectric materials can also be used for the carrier substrates. In the present case, copper or a copper alloy is used for the connector arrangement 14.

The carrier substrate 12, which is arranged on the carrier substrate 11 or on the connector arrangement 14 of the carrier substrate 11, comprises substrate recesses 15 which extend as through-holes from the top 18 of the carrier substrate 12 to the underside 19 of the carrier substrate 12, wherein the substrate recesses 15 in downward direction are delimited by the connector arrangement 14 which thus forms the bottom 20 of the substrate recesses 15. Arranged at the top 18 of the carrier substrate 12 is a further connector arrangement 21 which is arranged such that it extends at least in part around an upper aperture margin 22 of the substrate recesses 15. The connector arrangement 21 can be connected so as to adhere, for example in an integral manner, to the top 18 of the carrier substrate 12, or it can be formed independently of the carrier substrate 12, thus lying loosely on the top 18 of the carrier substrate 12.

In order to carry out the method which is explained in more detail below, as shown in FIGS. 1, 2 and 3, the carrier substrate arrangement 10 rests against a supporting base 23.

As shown, in FIG. 2, subsequently, in a first method-related step, a formed solder material part 24 is placed on each substrate recess 15. As shown in an exemplary way in FIG. 2, for this purpose the carrier substrate arrangement 10 is moved in the direction of feed 49, at a clocked speed, past a component placement device 25 by means of a base 23, which in the present case is a conveyor device. In the subsequent method-related step, a forming process of the formed solder material part 24 to form a formed contact part 50 takes place by means of a mechanical forming device 26, wherein the base 23 serves as a backstop for accommodating a forming force 27. The formed contact part 50 provides through-plating of the carrier substrate 12 between the connector arrangements 14 and 21. The forming force 27 results in a radial displacement of solder material of the formed solder material part 24, in the present case said radial displacement being delimited by an intrados surface 28 which is a cylinder jacket. Due to the plastic deformation of the solder material, the forming force 27 has a radial effect on the intrados surface 28 even after completion of the forming process. Furthermore, due to the larger material volume of the formed soldermaterial part 24 when compared to the volume of the substrate recess 15, as a result of the forming process, a contact head 29 forms at the upper end of the formed contact part 50, as shown in the example of the substrate recess 15 on the left in FIG. 2. Due to the forming process, the formed contact part 50 comprises a radial overhang 30 which in the region of the aperture margin 22 extends over an associated margin area 31 of the connector arrangement 21. It should be stressed that the radial overhang 30 is not necessary for generating a holding force acting between the connector arrangement 21 and the carrier substrate 12. The radially acting circumferential force which is transferred from the formed contact part 50 to the intrados surface 28 and a corresponding intrados surface 32 of the connector arrangement 21 is quite sufficient for this purpose. Only in the case where the connector arrangement 210 does not extend over a partial circumference of the aperture margin 22, which partial circumference is adequate for generating the holding force, is it necessary, in the case of a connector arrangement 21, which is arranged so as to be loose on the top 18 of the carrier substrate 12, to form a contact head 29 with overhang 30. Otherwise, forming a contact head without overhang is adequate, with said contact head being designed to be essentially flush in relation to the circumferential area of the formed contact part 50.

FIG. 3 shows the option of applying and subsequently re-melting, in a subsequent further method-related step, a further formed solder material part 51 which can be identical to or different from the formed solder material part 24, onto a contact surface 56 of the contact head 29 of the formed contact part 50 which is arranged in the substrate recess 15, by means of a component placement device 33 which can be of a design that is comparable or identical to that of the component placement device 25. As further shown in FIG. 3, the re-melting process results in the formation of a solder bump 53 which establishes through-plating, with a meniscus-shaped raised contact 35 on the formed contact part 50. As is further shown in FIG. 3, as a result of the surface tension of the liquefied solder material, the overhang 30 of the contact head 29, which overhang 30 was formed on the formed contact part 50 because of the mechanical forming process (FIG. 2), can recede.

Depending on the type of exposure to thermal energy by the formed solder material part 34 during the re-melting process, and depending on the type of material selected for the solder material part 34, melting of the entire formed solder material mass formed by the formed contact parts 50 and the formed solder parts 34 can take place, or melting of the formed solder material part 34 alone can take place.

FIGS. 4 and 5 show a contact substrate 37 (FIG. 4) and a contact substrate 38 (FIG. 5) which comprise a corresponding carrier substrate arrangement 39. In each case, the carrier substrate arrangement 39 comprises a carrier substrate 40 which on its underside 41 comprises a connector arrangement 42 which is arranged so as to adhere to the carrier substrate 40. Furthermore, the carrier substrate 40 comprises a substrate recess 43 which extends from a top 44 to a reverse side 45 of the connector arrangement 42. On the top 44 of the carrier substrate 40, a further connector arrangement 46 is provided which is formed independently of the carrier substrate 40.

For electrically conductive connection of the connector arrangements 42 and 46 and at the same time for mechanical securing of the connector arrangement 46 on the top 44 of the carrier substrate 40, a formed contact part 47 comprising a flat contact head 48 (FIG. 4) of the type of the formed contact part 50 shown in FIG. 2 is formed at the contact substrate 37. The contact head 48 comprises a flat contact surface 57.

As FIG. 5 shows in comparison to this, in the case of contact substrate 38, by re-melting the formed contact part 47, instead of a flat contact head 48 (FIG. 4,) it is possible to provide a meniscus-shaped raised contact 54 for generating a solder bump 55 as through-plating.

In the manufacture of a contact substrate 62 as shown in FIG. 6, after placement of a formed solder material part 63 into a substrate recess 64, exposure of the formed solder material part 63 to pressure takes place with a pressure stamp 58, such that as a result of a convex shaped contact surface 59 of the pressure stamp, a concave contact surface 65 is generated in a formed contact part 66. At the same time, a raised margin 60 of the formed contact part 66 arises, which margin 60 covers at least one intrados surface 67 of an upper connector arrangement 68. A centering device 69 formed in the contact surface 59 of the pressure stamp 58 ensures that the margin 60 is formed evenly.

FIG. 7 shows the formed contact part 66 after a re-melting process with a meniscus margin 71, which due to wetting of the connector arrangement 68 now both axially and radially protrudes beyond an aperture margin 70 of the connector arrangement 68.

The invention claimed is:

1. A method for producing a contact substrate with through-plating between a connector arrangement arranged at the top of a dielectric carrier substrate and the underside of the carrier substrate wherein the connector arrangement extends along an aperture margin of a substrate recess, and the underside of the carrier substrate is supported by a backstop, the method comprising:

forming the connector arrangement independently of the dielectric carrier substrate and arranging the connector arrangement on the top of the dielectric carrier substrate;

placing a formed solder material part in the substrate recess;

deforming said formed solder material part within the substrate recess so as to form a formed contact part with radial displacement of the material of the formed solder material part in the substrate recess to result in a non-positive connection between an intrados surface of the substrate recess and the connector arrangement with the formed contact providing through-plating between the connector arrangement and the underside of the carrier substrate and providing a connection between the connector arrangement and the carrier substrate, further comprising at least partly remelting the material of the formed contact part.

2. A method according to claim 1, wherein radial displacement of the material of the formed solder material part takes place by forming a disc-shaped contact head which protrudes both axially and radially beyond the aperture margin, with the connector arrangement being accommodated in the region of the aperture margin between the contact head and the top of the carrier substrate.

3. A method according to claim 1, wherein re-melting takes place using laser energy.

4. A method according to claim 1, wherein prior to placing the formed solder material part into the substrate recess, a second connector arrangement is arranged on the underside of the carrier substrate, between the carrier substrate and the backstop, such that the second connector arrangement at least in part forms a bottom of the substrate recess.

5. A method according to claim 1, wherein radial displacement of the material of the formed solder material part takes place using a pressure stamp with a convex contact surface, to provide both radial displacement and axial displacement of the material against the direction of pressure of the pressure stamp.

6. A method according to claim 1, wherein prior to placing the formed solder material part into the substrate recess, on the underside of the carrier substrate between the carrier substrate and the backstop a second connector arrangement is arranged, such that the second connector arrangement extends along a lower aperture margin of the substrate recess.

7. A method according to claim 1, further comprising prior to re-melting onto the contact head the formed contact part which is arranged in the substrate recess, applying a further formed solder material part and subsequently at least in part re-melting the solder material.

8. A method according to claim 1 providing a contact substrate with through-plating, the contact substrate comprising a carrier substrate and a conductor path structure arranged on the carrier substrate and formed independently of the carrier substrate, wherein the conductor path structure comprises a lower connector arrangement which is arranged on the underside of the carrier substrate, and an upper connector arrangement which is arranged on the top of the carrier substrate, and wherein a substrate recess extends between the connector arrangements, such that the lower connector arrangement at least in part forms a bottom of the substrate recess, and the upper connector arrangement extends at least in part over the aperture margin of the substrate recess, wherein through-plating between the lower connector arrangement and the upper connector arrangement is formed by a formed contact part with the formed contact part completely filling up the substrate recess and the end of the formed contact part, which end is situated opposite the bottom of the substrate recess, comprising a contact head which protrudes beyond the aperture margin both axially and radially, with said contact head being non-positively connected with the upper connector arrangement, thereby providing a mechanical connection between the upper connector arrangement and the lower connector arrangement for fixing the upper connector arrangement on the carrier substrate and for fixing the lower connector arrangement on the carrier substrate.

9. A method according to claim 5, wherein the exposure to pressure with the pressure stamp includes providing a contact surface comprising a centering device.

10. A method according to claim 6, wherein the second connector arrangement is arranged on a further carrier substrate.

11. A method according to claim 6, wherein the second connector arrangement is arranged on a further carrier substrate.

12. A method according to claim 7, wherein re-melting is carried out via laser energy.

13. A method according to claim 8, wherein the contact head is disc-shaped and comprises an essentially flat contact surface which extends parallel to the surface of the carrier substrate.

14. A method according to claim 8, wherein the contact head is a meniscus-shaped raised contact.

15. A method according to claim 8, wherein the lower conductor part arrangement is arranged on a further carrier substrate.

16. A contact substrate with through-plating, the contact substrate comprising a carrier substrate and a conductor path structure arranged on the carrier substrate and formed independently of the carrier substrate, lying loosely on a top of the carrier substrate, wherein the conductor path structure comprises a lower connector arrangement which is arranged on the underside of the carrier substrate, and an upper connector arrangement which is arranged on the top of the carrier substrate, and wherein a substrate recess extends between the connector arrangements, such that the lower connector arrangement at least in part forms a bottom of the substrate recess, and the upper connector arrangement extends at least in part around an aperture margin of the substrate recess, wherein through-plating between the lower connector arrangement and the upper connector arrangement is formed by way of a formed contact part with the end of the formed contact part, which end is situated opposite the bottom of the substrate recess, comprising a concave contact surface with a raised contact margin which is non-positively connected with the upper connector arrangement, thereby providing a mechanical connection between the upper connector arrangement and the lower connector arrangement for fixing the upper connector arrangement on the carrier substrate and for fixing the lower connector arrangement on the carrier substrate, manufactured by the method of:

forming the connector arrangement independently of the dielectric carrier substrate and arranging the connector arrangement on the top of the dielectric carrier substrate;

placing a formed solder material part in the substrate recess;

deforming said formed solder material part within the substrate recess so as to form a formed contact part with radial displacement of the material of the formed solder material part in the substrate recess to result in a non-positive connection between an intrados surface of the substrate recess and the connector arrangement with the formed contact providing through-plating between the connector arrangement and the underside of the carrier substrate and providing a connection between the connector arrangement and the carrier substrate, further comprising at least partly remelting the material of the formed contact part.

17. A contact substrate according to claim 16, wherein the lower conductor part arrangement is arranged on a further carrier substrate.

18. A method for producing a contact substrate with through-plating between a connector arrangement arranged at the top of a dielectric carrier substrate and the underside of the carrier substrate, wherein the connector arrangement extends along an aperture margin of a substrate recess, and the underside of the carrier substrate is supported by a backstop, the method comprising:

forming the connector arrangement independently of the dielectric carrier substrate and arranging the connector arrangement on the top of the dielectric carrier substrate;

placing a formed solder material part in the substrate recess;

deforming said formed solder material part within the substrate recess so as to form a formed contact part with radial displacement of the material of the formed solder material part in the substrate recess to result in a non-positive connection between an intrados surface of the substrate recess and the connector arrangement with the formed contact providing through-plating between the connector arrangement and the underside of the carrier substrate and providing a connection between the connector arrangement and the carrier substrate, further comprising at least partly remelting the material of the formed contact part, the purely non-positive connection which has been produced by forming the formed body, which connection in any case makes possible at least temporary fixation of the connector arrangement to the carrier substrate, which can be converted into a permanent integral fixation, wherein re-melting takes place using laser energy.

19. A method according to claim 18, further comprising prior to re-melting onto the contact head the formed contact part which is arranged in the substrate recess, applying a further formed solder material part and subsequently at least in part re-melting the solder material, wherein re-melting is carried out via laser energy.

* * * * *